(12) United States Patent
Lin et al.

(10) Patent No.: US 8,460,960 B2
(45) Date of Patent: Jun. 11, 2013

(54) METHOD FOR FABRICATING INTEGRATED CIRCUIT

(75) Inventors: Meng-Jia Lin, Changhua County (TW); Bang-Chiang Lan, Taipei (TW); Ming-I Wang, New Taipei (TW); Chien-Hsin Huang, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 181 days.

(21) Appl. No.: 13/186,607

(22) Filed: Jul. 20, 2011

(65) Prior Publication Data

US 2013/0023081 A1    Jan. 24, 2013

(51) Int. Cl.
*H01L 21/00* (2006.01)

(52) U.S. Cl.
USPC .............................................. 438/50; 438/53

(58) Field of Classification Search
USPC ......................................................... 438/50
See application file for complete search history.

(56) References Cited

U.S. PATENT DOCUMENTS

| 2006/0105543 | A1* | 5/2006 | Xiao et al. | 438/459 |
| 2009/0090693 | A1* | 4/2009 | Wang | 216/41 |
| 2009/0243004 | A1* | 10/2009 | Lan et al. | 257/415 |
| 2013/0056858 | A1* | 3/2013 | Ding et al. | 257/622 |

* cited by examiner

*Primary Examiner* — Daniel Whalen

(74) *Attorney, Agent, or Firm* — WPAT, PC; Justin King

(57) ABSTRACT

A method for fabricating integrated circuit is provided. First, a first interconnect structure including a plurality of first dielectric layers and a plurality of first conductive patterns stacked therewith alternately is formed on a MEMS region of a conductive substrate. Next, an interlayer is formed on the first interconnect structure and covering the first conductive patterns. Next, a poly silicon mask layer corresponding to the first conductive patterns is formed on the interlayer and exposing a portion of the media layer. Next, the portion of the interlayer exposed by the poly silicon mask layer and a portion of the first dielectric layer corresponding thereto are removed to form a plurality of openings. Then, a portion of the conductive substrate in the MEMS region is removed.

15 Claims, 7 Drawing Sheets

METHOD FOR FABRICATING INTEGRATED CIRCUIT

BACKGROUND

1. Technical Field

The present invention generally relates to a method for fabricating an integrated circuit and more particularly to a method for fabricating an integrated circuit with a MEMS structure.

2. Description of the Related Art

Micro electromechanical system (MEMS) technique has established a whole new technical field and industry. The MEMS technique has been widely used in a variety of microelectronic devices that have electronic and mechanical properties, for example, pressure sensors, accelerators and micromicrophones.

Furthermore, complementary metal oxide semiconductor (CMOS) process is usually used to fabricate the MEMS for decreasing the cost and integrating the process of the MEMES and the driving circuit thereof. During the fabricating process of the integrated circuit integrates CMOS device and the MEMS device, a metal layer is used to be a hard mask when the dielectric layer of the interconnect structure is etched for forming the MEMS device suspending above the substrate.

However, the metal layer as the hard mask is difficult to be removed, and the residual metal layer may induce eddy current during the operation of the integrated circuit. Therefore, the electricity of the MEMS device would be interfered.

BRIEF SUMMARY

Accordingly, the invention is directed to a method for fabricating an integrated circuit, which can increase the efficiency of the micro electromechanical system.

The invention provides a method for fabricating an integrated circuit including the following steps. First, a conductive substrate with a logic circuit region and a MEMS region is provided. Second, a first interconnect structure is formed on the MEMS region of the conductive substrate. The first interconnect structure includes a plurality of first dielectric layers and a plurality of first conductive patterns stacked therewith alternately on the MEMS region. Next, an interlayer is formed on the first interconnect structure to cover the first conductive patterns. Next, a poly-Si mask layer corresponding to the first conductive patterns is formed on the interlayer. Further, a portion of the interlayer is exposed by the poly-Si mask layer. Next, the portion of the interlayer exposed by the poly-Si mask layer and the corresponding portions of the first dielectric layers are removed by using the poly-Si mask layer as a mask. Therefore, a plurality of openings are formed in the first interconnect structure. Then, a portion of the conductive substrate in the MEMS region is removed.

In an embodiment of the invention, a plurality of shallow trench isolations is further formed in the conductive substrate.

In an embodiment of the invention, the shallow trench isolations are disposed within the logic circuit region of the conductive substrate.

In an embodiment of the invention, the shallow trench isolations are disposed within the logic circuit region and the MEMS region. Moreover, a portion of the shallow trench isolation disposed within the MEMS region is removed while the portions of the first dielectric layers are removed.

In an embodiment of the invention, the interlayer is formed by a high density plasma chemical vapor deposition process and a plasma enhanced chemical vapor deposition process. In detail, a first interlayer is firstly formed on the first interconnect structure by the high density plasma chemical vapor deposition process, and then a second interlayer is formed on the first interlayer by the plasma enhanced chemical vapor deposition process.

In an embodiment of the invention, a precursor gas used in the plasma enhanced chemical vapor deposition process is, for example, tetraethoxy silane (so-called TEOS).

In an embodiment of the invention, the portion of the MEMS region of the conductive substrate may be removed by putting an etch gas into the openings of the first interconnect structure.

In an embodiment of the invention, the etch gas is, for example, sulfur hexafluoride (SF6).

In an embodiment of the invention, the poly-Si mask layer is further removed while the portion of the conductive substrate in the MEMS region is removed.

In an embodiment of the invention, a protective layer is further formed on the interlayer to cover the poly-Si mask layer before the portion of the interlayer is removed.

In an embodiment of the invention, the protective layer comprises an oxide layer and a nitride layer sequentially stacked on the interlayer. The oxide layer is formed on the interlayer to cover the poly-Si mask layer and the nitride layer is formed on the oxide layer.

In an embodiment of the invention, the material of the oxide layer is, for example, phosphosilicate glass (PSG). The material of the nitride layer is, for example, silicon nitride.

In an embodiment of the invention, a portion of the protective layer is further removed to expose the poly-Si mask layer before the portion of the interlayer is removed.

In an embodiment of the invention, a semiconductor element and a second interconnect structure are further formed on the logic circuit region of the conductive substrate. The second interconnect structure includes a plurality of second dielectric layers and a plurality of second conductive patterns The second dielectric layers and the second conductive patterns alternately stacked on the logic circuit region of the conductive substrate. The semiconductor is electrically connected with the second interconnect structure.

Since there is etching selectivity between the poly silicon and the oxide, a poly-Si mask layer is formed on the interconnect structure and is used as a hard mask to etch the dielectric layer of the interconnect structure in this invention. Furthermore, the poly-Si mask layer may be removed without any residue on the interconnect structure which is going to be micro electromechanical system device during the etch process of the integrated circuit. Therefore, the efficiency of micro electromechanical system may be improved.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The integrated circuit of the invention is fabricated by CMOS process. A MEMS integrated to a CMOS circuit would be described as examples in the following embodiments, but the invention is not limited hereto. The invention also can be applied in a MEMS structure without CMOS circuit.

Figure 1A:
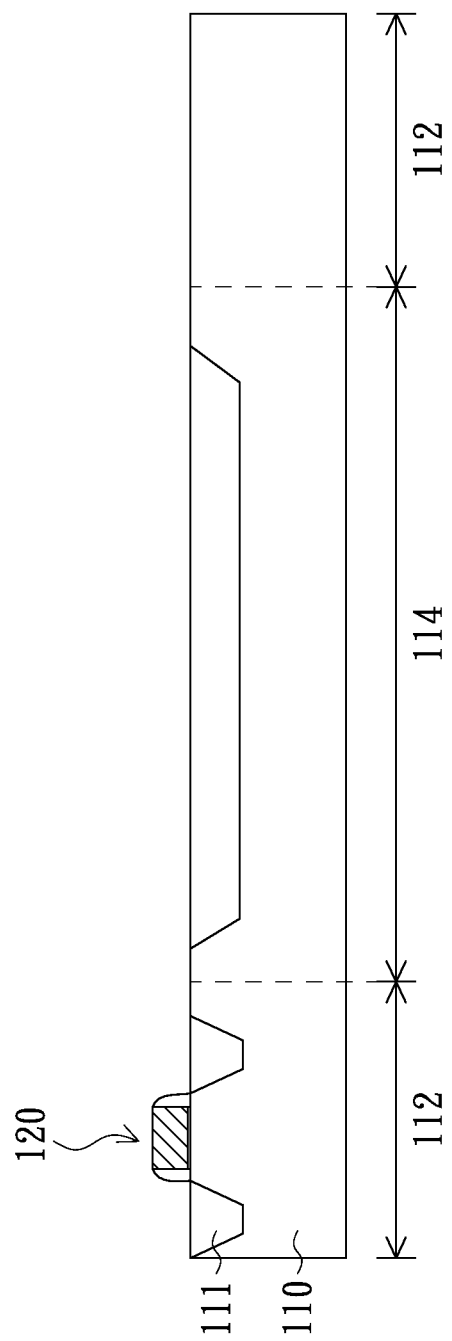
FIG. 1A through FIG. 1G are schematic cross-sectional views illustrating parts of fabricating process steps of an integrated circuit in accordance with an embodiment of the present invention.

FIG. 1A through FIG. 1G are schematic cross-sectional views illustrating parts of fabricating process steps of an integrated circuit in accordance with an embodiment of the present invention. Referring to FIG. 1A, a conductive substrate 110 has a logical circuit region 112 and a MEMS region 114 is provided. In this embodiment, the conductive substrate may be silicon substrate or silicon on insulator substrate. Then, at least a semiconductor device 120 is formed on the logical circuit region 202. In this embodiment, the semiconductor device 120 is, for example, complementary metal oxide semiconductor (so-called CMOS). Specifically, if there is a plurality of semiconductor devices 120 formed in the logic circuit region 112, the semiconductor devices 120 would be separated from each other by the shallow trench isolations 111.

It should be noted that the shallow trench isolation 111 also can be formed in the logic region 112 and the MEMS region 114 simultaneously, as shown in FIG. 1A, but it is not limited hereto.

Figure 1B:
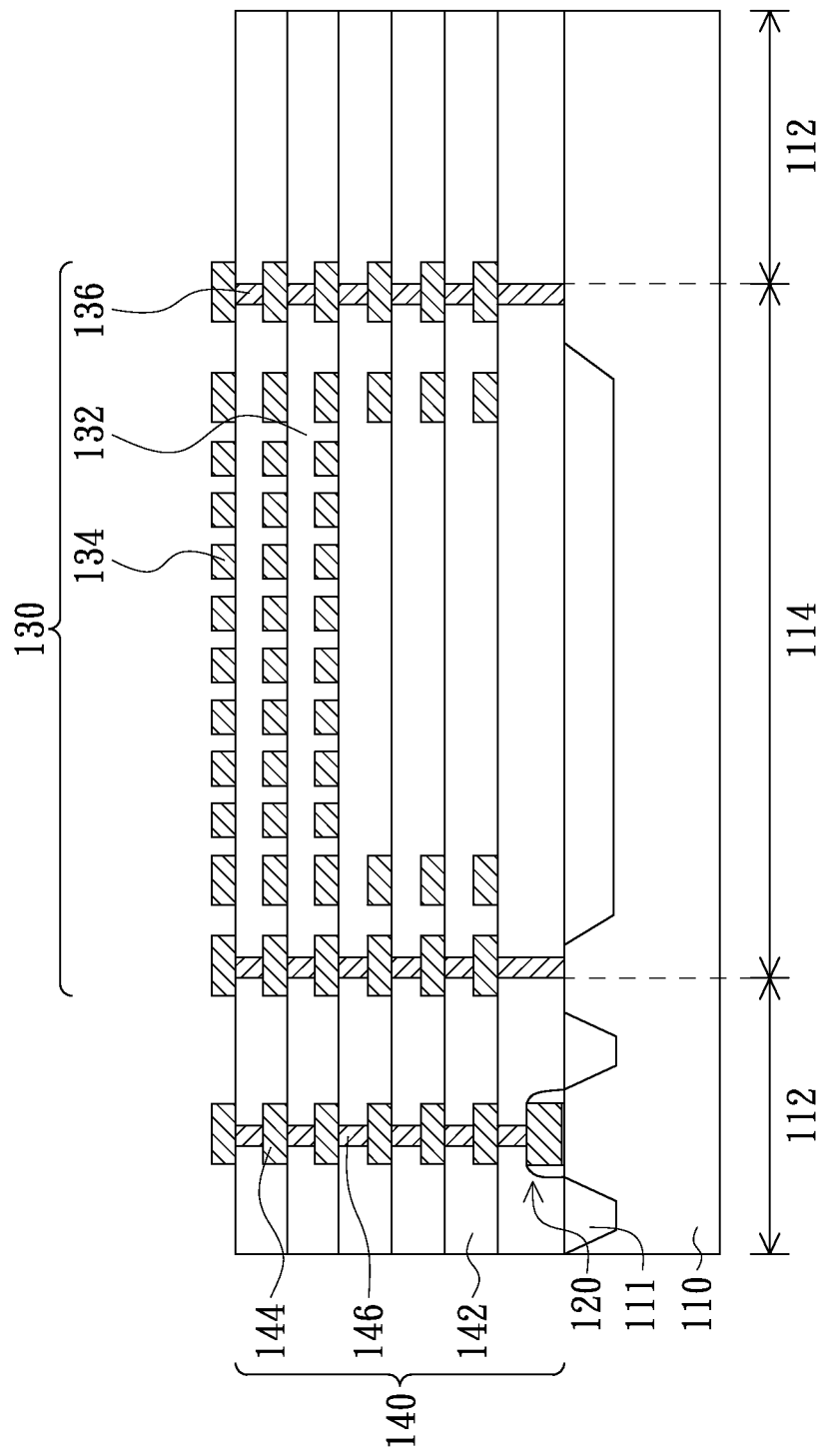

Referring to FIG. 1B, a first interconnect structure 130 including a plurality of first dielectric layers 132, a plurality of first conductive patterns 134 and a plurality of contact vias 136 is formed on the MEMS region 114 of the conductive substrate 110. Simultaneously, a second interconnect structure 140 including a plurality of second dielectric layers 142, a plurality of second conductive patterns 144 and a plurality of contact vias 146 is formed on the logic circuit region 112 of the conductive substrate 110. The first conductive patterns 134 are stacked and interlaced with the first dielectric layers 132 and the conductive patterns 134 formed in two adjacent layers are electrically connected to each other by the contact vias 136 formed in the first dielectric layer 132. Further, at least a portion of the conductive patterns 144 is electrically connected to the semiconductor device 120 through the contact vias 146.

Figure 1C:
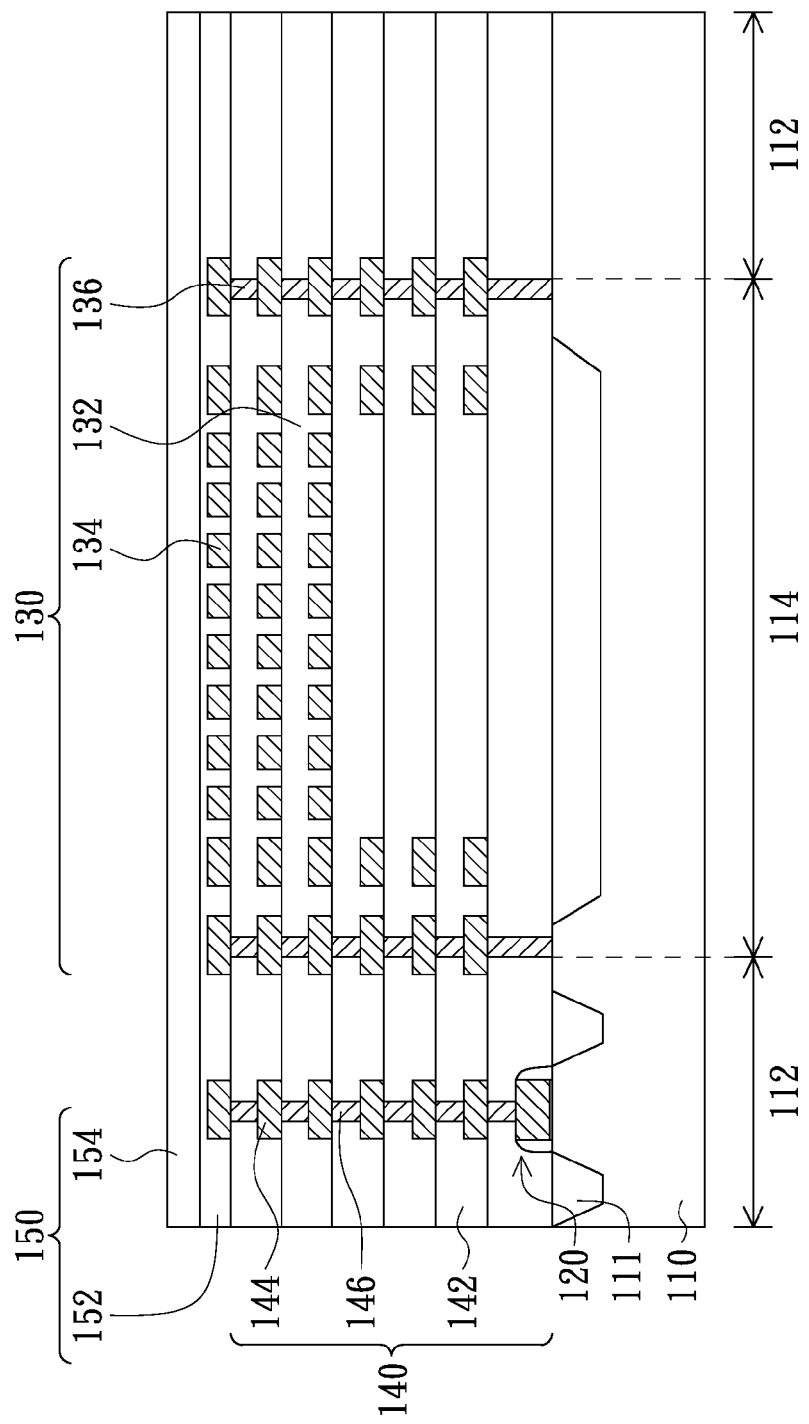

Referring to FIG. 1C, an interlayer 150 is formed on the first interconnect structure 130 and the second interconnect structure 140 and covers the first conductive patterns 134 and the second conductive patterns 144. In this embodiment, the interlayer 150 includes a first interlayer 152 and a second interlayer 154 stacked on the first interconnect structure 130 and the second interconnect structure 140 sequentially. In detail, a high density plasma chemical vapor deposition (so-called HDPCVD) process is performed to form the first interlayer 152 on the interconnect structure 130 and the second interconnect structure 140, then a plasma enhanced chemical vapor deposition (so-called PECVD) process is performed to form the second interlayer 154 on the first interlayer 152. In this embodiment, a precursor gas used in the PECVD process for forming the second interlayer 154 is tetraethoxy silane (so-called TEOS).

Figure 1D:
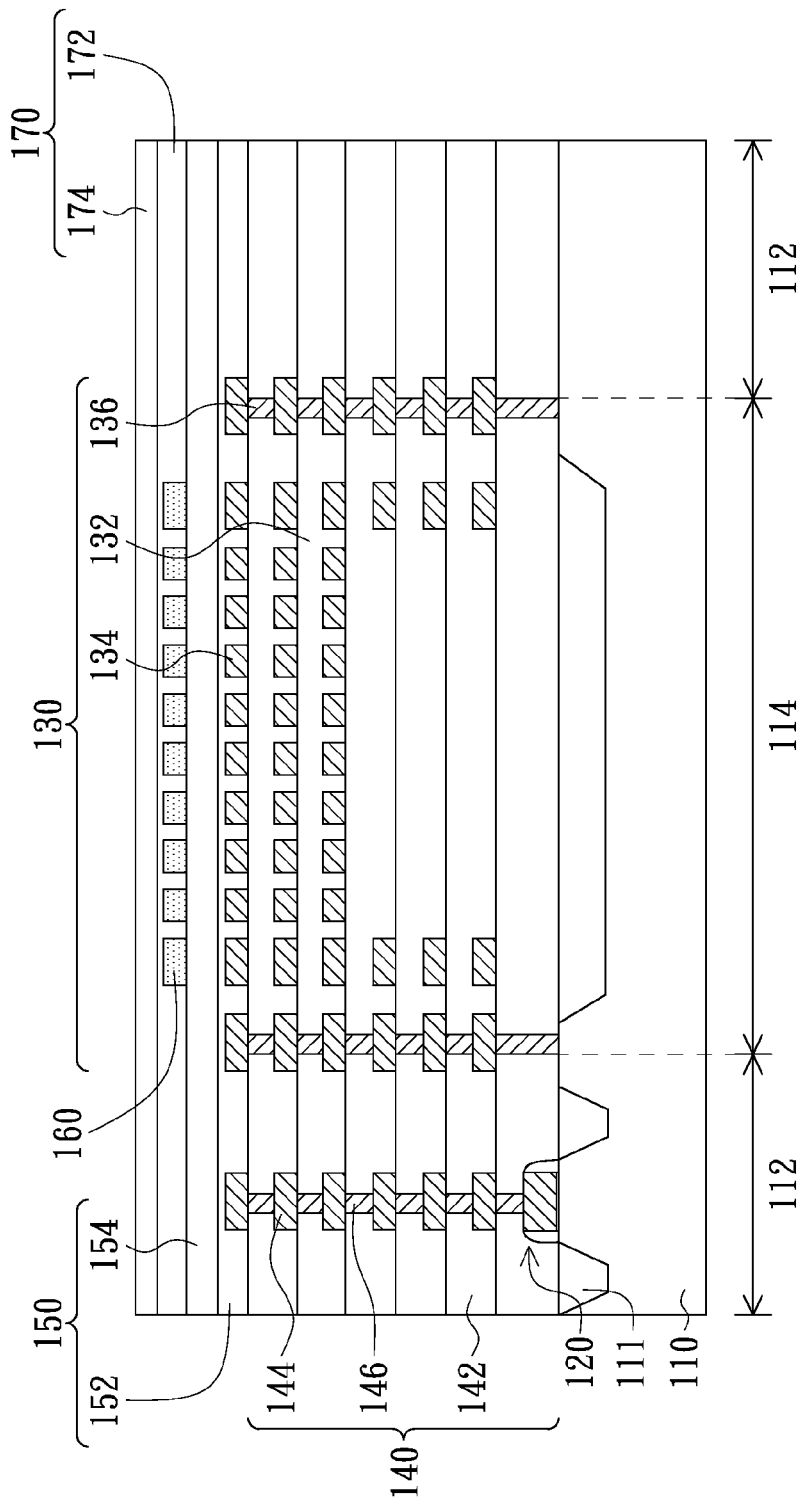

Referring to the FIG. 1D, a poly-Si mask layer 160 is formed on the interlayer 150 above the first interconnect structure 130. The poly-Si mask layer 160 corresponds to the first conductive patterns 134 and a portion of the interlayer 150 is exposed by the poly-Si mask layer 160. In specific, the adhesion between the poly-Si mask layer 160 and the first interconnect structure 130 can be increased by the interlayer 150.

In this embodiment, a protective layer 170 is formed on the interlayer 150 for covering the poly-Si mask layer 160. The protective layer includes, for example, an oxide layer 172 and a nitride layer 174 stacked thereon. The material of the oxide layer 172 may be phosphosilicate glass (so-called PSG) and the thickness thereof is about 0.5 micrometer. The material of the nitride layer 174 may be silicon nitride and the thickness thereof is about 0.7 micrometer.

Figure 1E:
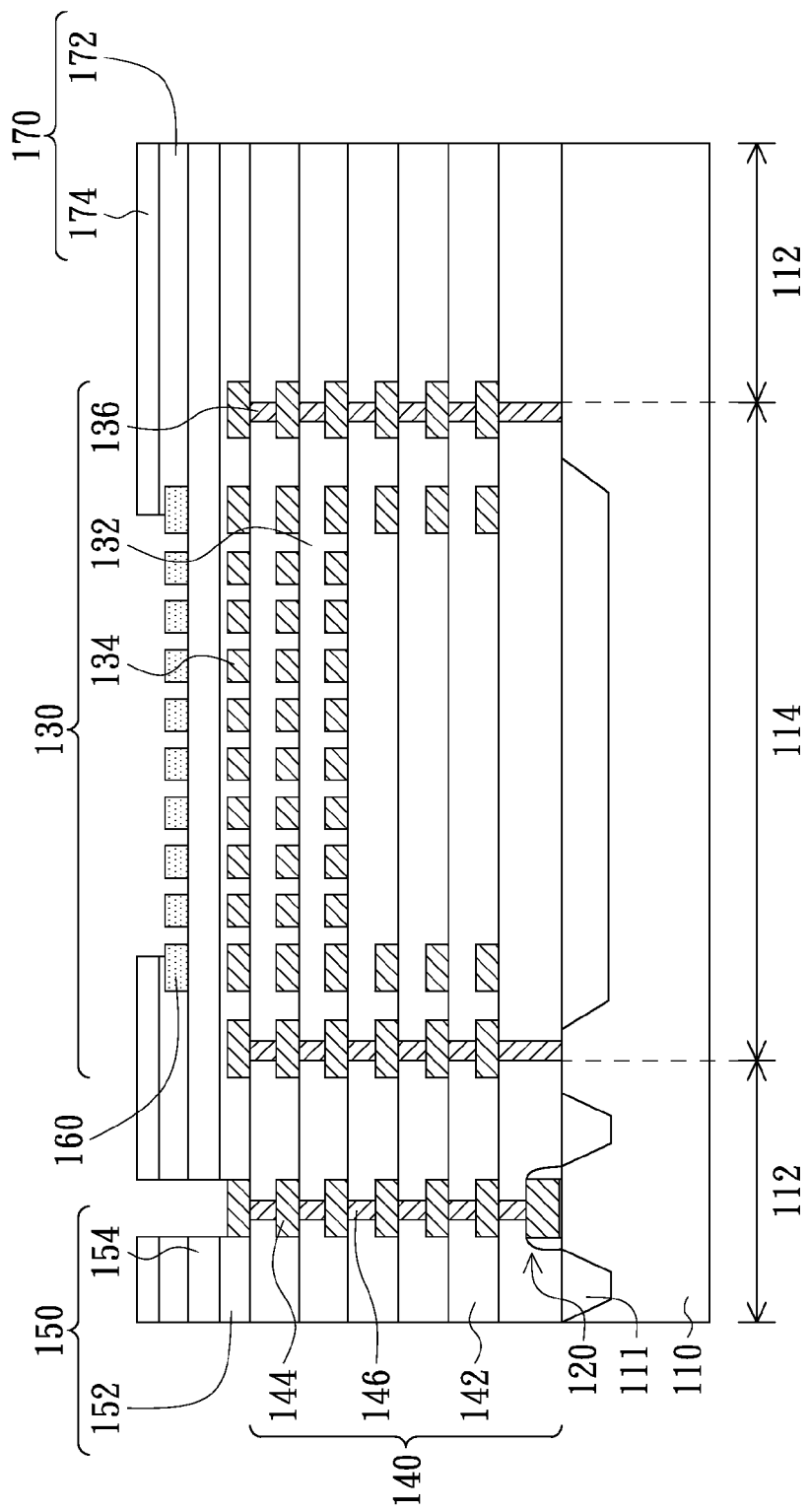

Referring to FIG. 1E, a portion of the protective layer 170 is removed to expose the poly-Si mask layer 160. In specific, a patterned photoresist layer (not shown) is formed on the protective layer 170 to define the portion of the protective layer 170 being removed. After the portion of the protective layer 170 is removed for exposing the poly-Si mask layer 160 by using the patterned photoresist layer as a mask, the photoresist layer is removed.

Especially, the portion of the protective layer 170 and the portion of the interlayer 150 above the logic circuit region 112 may be removed to expose the highest second conductive patterns 144 before the portion of the protective layer 170 above the MEMS region 114. The exposing highest second conductive patterns 144 are used to be contact pads and the semiconductor device 120 can electrically connect with external circuit for electricity test through the contact pads.

Figure 1F:
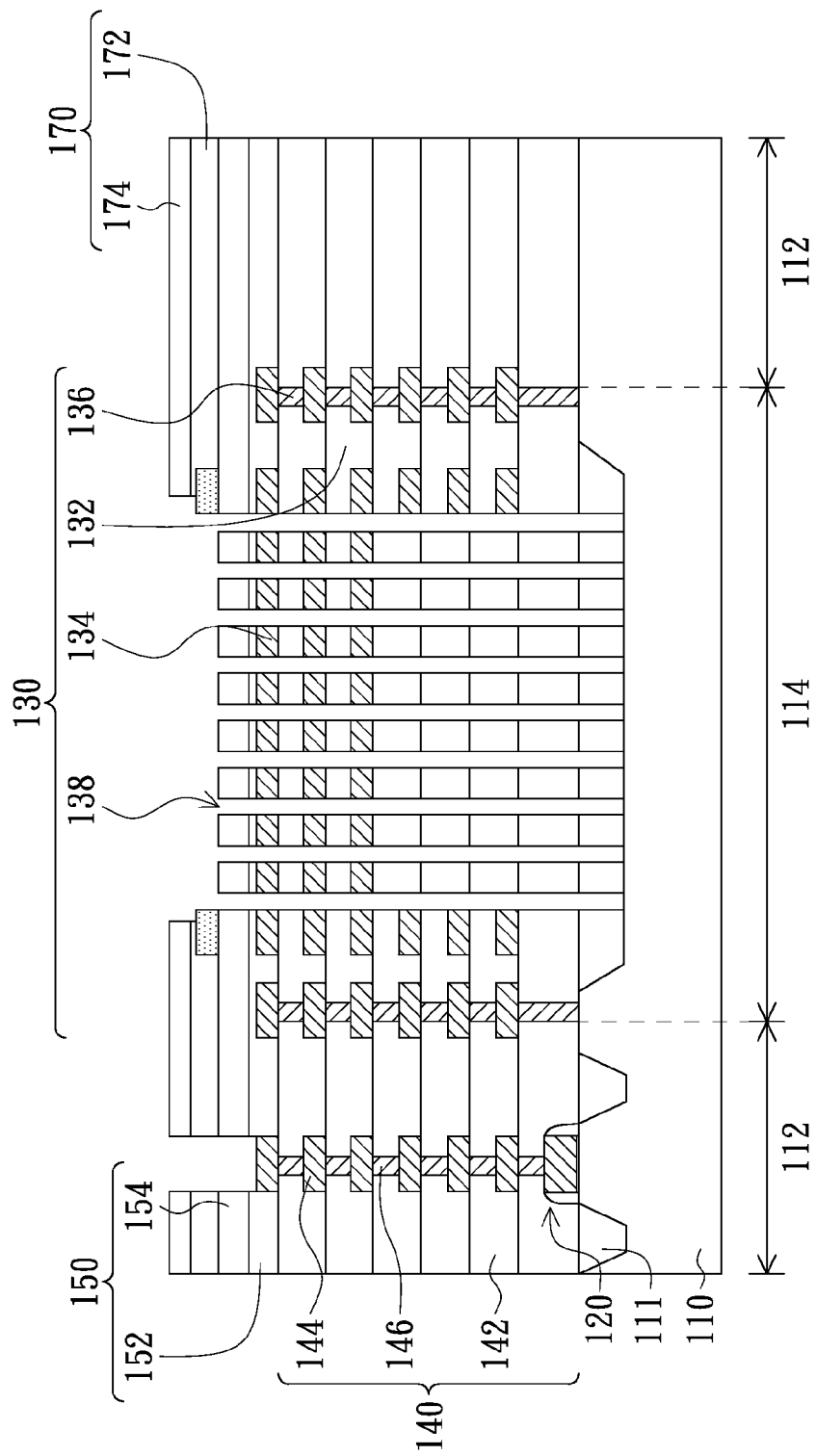

After removing the portion of the protective layer 170 above the MEMS region 114, since there are etch selectivities between the poly-Si mask layer 160 and the interlayer 150 and the poly-Si mask layer 160 and the first dielectric layer 132, the portion of the interlayer 150 exposed by the poly-Si mask layer 160 and the portion of the first dielectric layers 132 under the portion of the interlayer 150 are removed by using the poly-Si mask layer 160 as a mask. Therefore, a plurality of openings 138 are formed in the first interconnect structure 130, as shown in FIG. 1F. Moreover, a portion of the shallow trench isolation 111 in the MEMS region 114 is removed during the process of forming the openings 138. Accordingly, a portion of the conductive substrate 110 is exposed.

It should be known that the first interconnect structure 130 includes the plurality of first dielectric layers 132, that is, the thickness of the first dielectric layers 130 being removed for forming the openings 138 is larger than the thickness of the poly-Si mask layer 160. Accordingly, the poly-Si mask layer 160 may be removed during the etching process of the first dielectric layer 132.

Furthermore, in other embodiment of the invention, the poly-Si mask layer 160 may remain after the etch process of the first dielectric layer 132 is performed through adjusting the etch selectivity between the first dielectric layer 132 and the poly-Si mask layer 160.

Figure 1G:
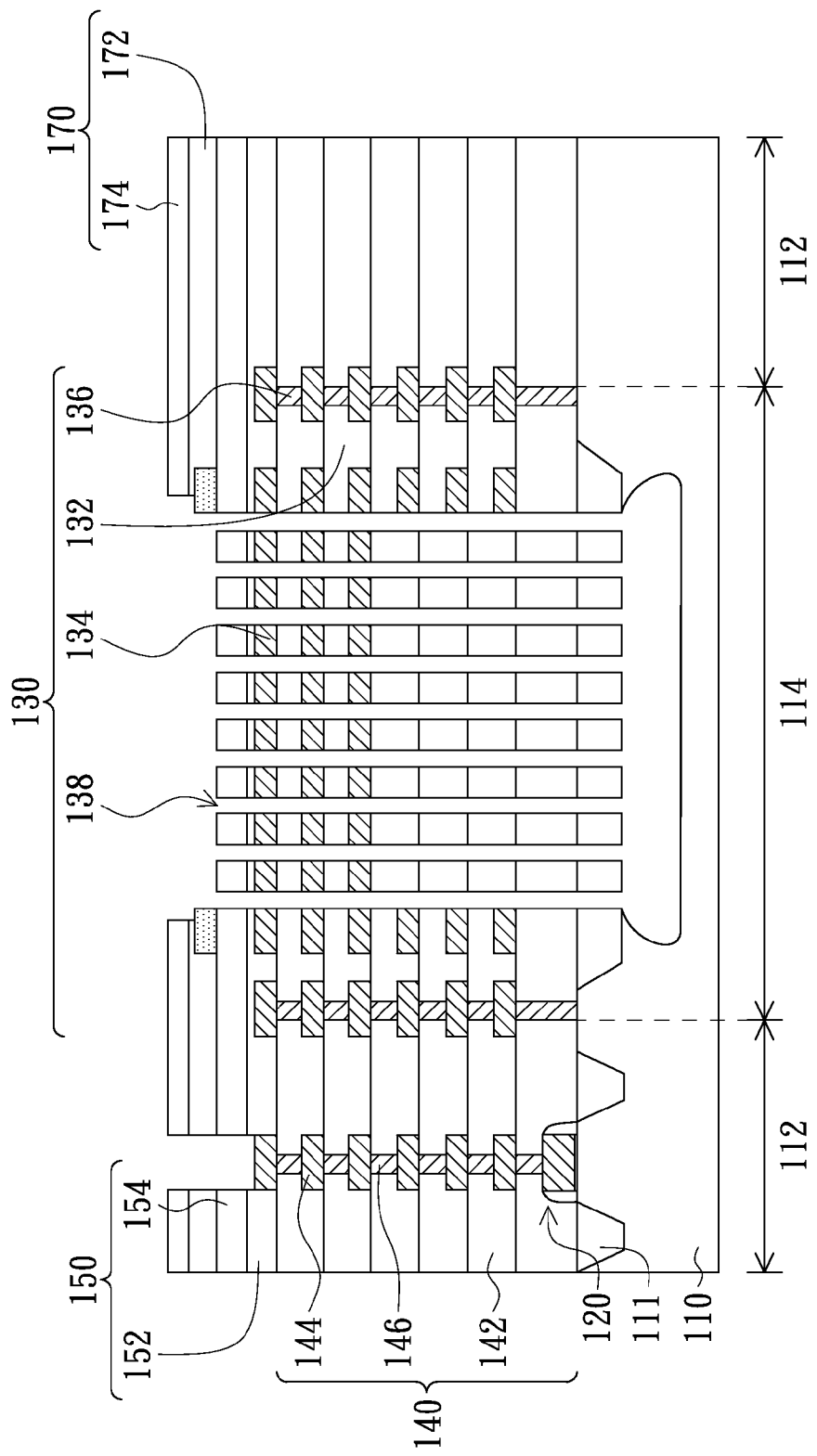

Referring to FIG. 1G, a portion of the conductive substrate 110 in the MEMS region 114 is removed. Accordingly, a portion of the first interconnect structure 130 is suspended above the conductive substrate 110 as a MEMS device. In this embodiment, the portion of the first interconnect structure 130 suspending above the conductive substrate 110 may be cantilevers to compose an accelerators, but it is not limited hereto. It should be noted that if the poly-Si mask layer 160 remained on the interlayer 150 after performing the etch process of the first dielectric layer 132, the poly-Si mask layer 160 can be removed while the portion of the conductive substrate 110 in the MEMS region 114 is removed.

In summary, during the process for fabricating an integrated circuit disclosed in the invention, an interlayer is formed on the interconnect structure for covering the highest conductive patterns of the interconnect structure, and then a poly-Si mask layer is formed on the interlayer. Since there is an etch selectivity between the poly silicon and the oxide, the poly-Si mask layer can be a hard mask during the etch process of the dielectric layer of the interconnect structure. Furthermore, the poly-Si mask layer may be removed without any residue, the efficiency of the MEMS device may be improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for fabricating an integrated circuit, comprising:
providing a conductive substrate with a logical circuit region and a MEMS region;
forming a first interconnect structure comprising a plurality of first dielectric layers and a plurality of first conductive patterns on the MEMS region of the conductive substrate, the first dielectric layers and the first conductive patterns alternately stacked on the MEMS region of the conductive substrate;
forming an interlayer to cover the first conductive patterns on the first interconnect structure;
forming a poly-Si mask layer corresponding to the first conductive patterns and exposing a portion of the interlayer on the interlayer;
removing the portion of the interlayer exposed by the poly-Si mask layer and corresponding portions of the first dielectric layers through using the poly-Si mask layer as a mask for forming a plurality of openings within the first interconnect structure; and removing a portion of the conductive substrate in the MEMS region.

2. The method as claimed in claim 1, further comprises the step of forming a plurality of shallow trench isolations in the conductive substrate.

3. The method as claimed in claim 2, wherein the shallow trench isolations dispose in the logic circuit region.

4. The method as claimed in claim 2, wherein the shallow trench isolations dispose in the logic circuit region and the MEMS region.

5. The method as claimed in claim 4, further comprises the step of removing a portion of the shallow trench isolation in the MEMS region while removing the portions of the first dielectric layers.

6. The method as claimed in claim 1, wherein the interlayer comprises a first interlayer and a second interlayer sequentially stacked on the first interconnect structure, the steps of forming the interlayer comprising:
performing a high density plasma chemical vapor deposition process to form a first interlayer on the first interconnect structure; and
performing a plasma enhanced chemical vapor deposition process to form a second interlayer on the first interlayer.

7. The method as claimed in claim 6, wherein the plasma enhanced chemical vapor deposition process is performed by using tetraethoxy silane as a precursor gas.

8. The method as claimed in claim 1, wherein the step of removing the portion of the conductive substrate in the MEMS region comprises putting a etch gas into the openings of the first interconnect structure.

9. The method as claimed in claim 1, wherein the etch gas comprises sulfur hexafluoride.

10. The method as claimed in claim 1, further comprises the step of removing the poly-Si mask layer while removing the portion of the MEMS region of the conductive substrate.

11. The method as claimed in claim 1, further comprises the step of forming a protective layer on the interlayer to cover the poly-Si mask layer before removing the portion of the interlayer.

12. The method as claimed in claim 11, wherein the protective layer comprises an oxide layer and a nitride layer sequentially stacked on the interlayer, the steps of forming the protective layer comprising:
forming an oxide layer on the interlayer to cover the poly-Si mask layer; and
forming a nitride layer on the oxide layer.

13. The method as claimed in claim 11, wherein the material of the oxide layer comprises phosphosilicate glass and the material of the nitride layer comprises silicon nitride.

14. The method as claimed in claim 11, further comprises the step of removing a portion of the protective layer to expose the poly-Si mask layer before removing the interlayer.

15. The method as claimed in claim 1, further comprises the step of forming at least a semiconductor element and a second interconnect structure comprising a plurality of second dielectric layers and a plurality of second conductive patterns on the logic circuit region of the conductive substrate sequentially, wherein the second interconnect structure electrically connected with the semiconductor element, the second dielectric layers and the second conductive patterns alternately stacked on the logic circuit region of the conductive substrate.

* * * * *